US009685537B1

(12) United States Patent
Xie et al.

(10) Patent No.: US 9,685,537 B1
(45) Date of Patent: Jun. 20, 2017

(54) GATE LENGTH CONTROL FOR VERTICAL TRANSISTORS AND INTEGRATION WITH REPLACEMENT GATE FLOW

(71) Applicant: GLOBALFOUNDRIES Inc., Grand Cayman (KY)

(72) Inventors: Ruilong Xie, Schenectady, NY (US); Tenko Yamashita, Schenectady, NY (US); Kangguo Cheng, Schenectady, NY (US); Chun-Chen Yeh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/280,521

(22) Filed: Sep. 29, 2016

(51) Int. Cl.
*H01L 29/78* (2006.01)
*H01L 29/41* (2006.01)
(Continued)

(52) U.S. Cl.
CPC .. *H01L 29/66666* (2013.01); *H01L 21/31051* (2013.01); *H01L 21/31144* (2013.01); *H01L 29/4238* (2013.01); *H01L 29/42376* (2013.01); *H01L 29/66787* (2013.01); *H01L 29/66795* (2013.01); *H01L 2029/7858* (2013.01)

(58) Field of Classification Search
CPC .......... H01L 29/42376; H01L 29/6666; H01L 29/66787; H01L 29/66795; H01L 29/7827; H01L 29/785; H01L 2029/7858
See application file for complete search history.

(56) References Cited

U.S. PATENT DOCUMENTS 6,406,962 B1 * 6/2002 Agnello ................ H01L 21/84
257/E21.703
6,667,143 B2 * 12/2003 Nirmal ................ B41M 3/006
156/234

(Continued)

OTHER PUBLICATIONS

Hergenrother et al., The Vertical Replacement-Gate (VRG) MOSFET: A 50-nm Vertical MOSFET with Lithography-Independent Gate Length, 1999, IEEE, IEDM 99: 75-78.*

(Continued)

*Primary Examiner* — Zandra Smith
*Assistant Examiner* — Molly Reida
(74) *Attorney, Agent, or Firm* — Wayne F. Reinke, Esq.; Heslin Rothenberg Farley & Mesiti P.C.

(57) ABSTRACT

A method of fabricating a vertical transistor is provided, the method including providing a starting semiconductor structure, the starting semiconductor structure including a semiconductor substrate, an impurity layer of n-type or p-type over the semiconductor substrate, a first hard mask layer over the semiconductor layer, a first dielectric layer over the first hard mask layer, a second hard mask layer over the first dielectric layer, a second dielectric layer over the second hard mask layer and a protective layer over the second dielectric layer. The method further includes patterning the second dielectric layer and protective layer, the patterning forming an opening therein, forming a wrap-around spacer on an inner sidewall of the opening, the forming leaving a smaller opening, forming a vertical channel, and setting a gate length of a wrap-around gate by removing an outer portion of the structure.

8 Claims, 15 Drawing Sheets

(51) Int. Cl.
*H01L 21/336* (2006.01)
*H01L 29/66* (2006.01)
*H01L 21/311* (2006.01)
*H01L 21/3105* (2006.01)
*H01L 29/423* (2006.01)

(56) References Cited

U.S. PATENT DOCUMENTS

| | | | |
|---|---|---|---|
| 6,690,040 B2* | 2/2004 | Chaudhry | H01L 21/823487 257/107 |
| 6,709,904 B2* | 3/2004 | Chaudhry | H01L 21/84 257/E21.703 |
| 2002/0060338 A1* | 5/2002 | Zhang | H01L 29/66545 257/328 |
| 2003/0047749 A1* | 3/2003 | Chaudhry | H01L 21/823487 257/135 |
| 2003/0064567 A1* | 4/2003 | Chaudhry | H01L 21/84 438/400 |

OTHER PUBLICATIONS

Hergenrother et al., The Vertical Replacement-Gate (VRG) MOSFET, 2002, Solid-State Electronics 46 (2002) 939-950.*

* cited by examiner

GATE LENGTH CONTROL FOR VERTICAL TRANSISTORS AND INTEGRATION WITH REPLACEMENT GATE FLOW

BACKGROUND OF THE INVENTION

Technical Field

The present invention generally relates to vertical transistors. More particularly, the present invention relates to controlling a gate length of a vertical transistor.

Background Information

In the recent past, the industry has indicated that vertical transistors may be an option as transistors continue downwardly scaling. However, some challenges remain, for example, how to control the gate length of vertical transistors.

Thus, a need continues to exist for gate-length control in the fabrication of vertical transistors.

SUMMARY OF THE INVENTION

The shortcomings of the prior art are overcome and additional advantages are provided through the provision, in one aspect, of a method of fabricating a vertical transistor. The method includes providing a starting semiconductor structure, the starting semiconductor structure including a semiconductor substrate, an impurity layer of n-type or p-type over the semiconductor substrate, a first hard mask layer over the semiconductor layer, a first dielectric layer over the first hard mask layer, a second hard mask layer over the first dielectric layer, a second dielectric layer over the second hard mask layer, and a protective layer over the second dielectric layer. The method further includes patterning the second dielectric layer and the protective layer, the patterning forming an opening therein, forming a wrap-around spacer on an inner sidewall of the opening, the forming leaving a smaller opening, forming a vertical channel, and setting a gate length of a wrap-around gate by removing an outer portion of the structure.

These, and other objects, features and advantages of this invention will become apparent from the following detailed description of the various aspects of the invention taken in conjunction with the accompanying drawings.

DETAILED DESCRIPTION OF THE INVENTION

Figure 1:
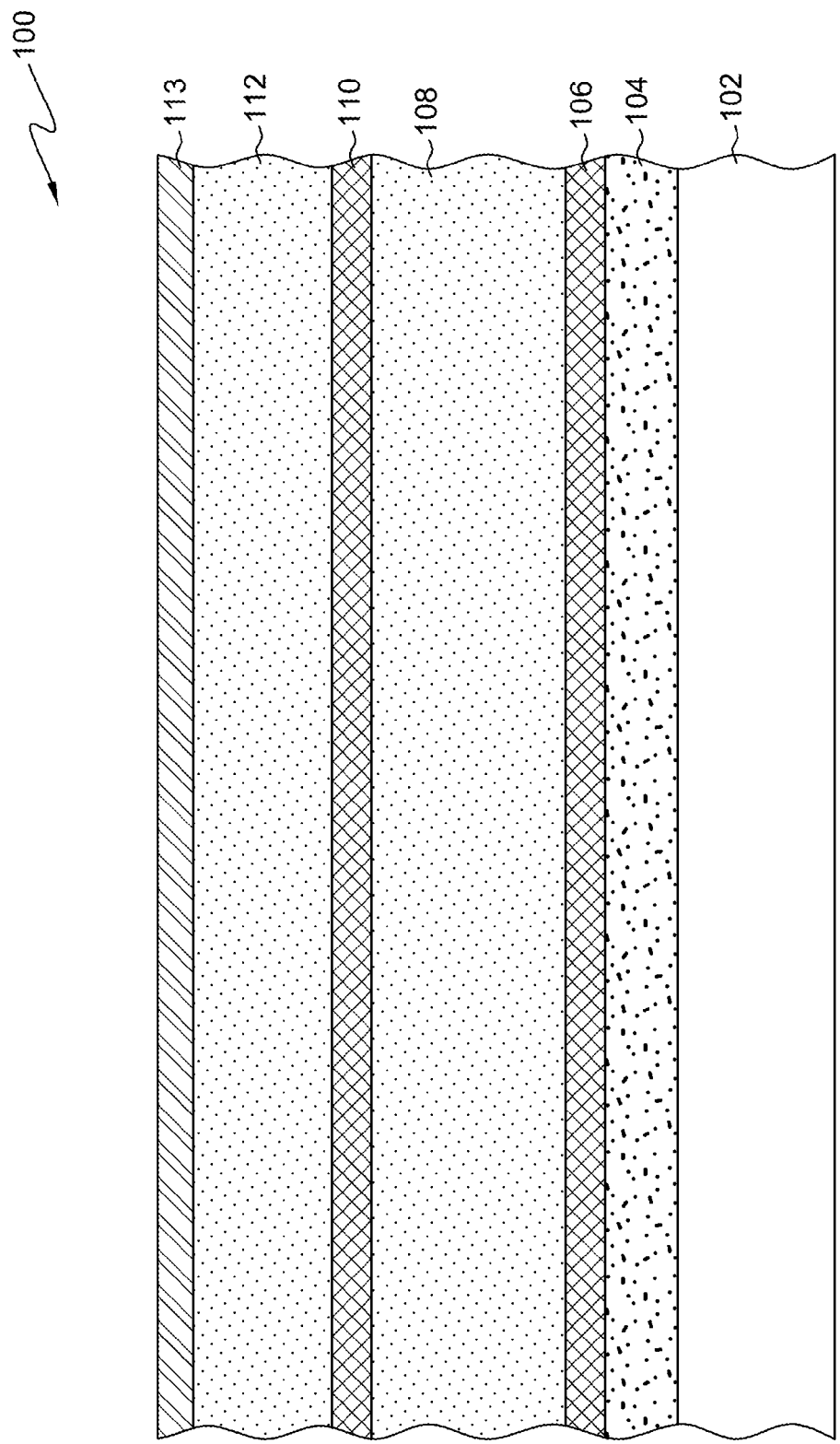
FIG. 1 is a cross-sectional view of one example of a starting semiconductor structure, the starting semiconductor structure including a semiconductor substrate, an impurity layer of n-type or p-type (e.g., N+ or P+ doped) over the semiconductor substrate, a first hard mask layer (e.g., silicon boron carbon nitride or silicon nitride) over the semiconductor layer, a first dielectric layer (e.g., silicon dioxide) over the first hard mask layer, a second hard mask layer over the first dielectric layer, a second dielectric layer over the second hard mask layer and a protective layer over the second dielectric layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the starting semiconductor structure including a semiconductor substrate 102, an impurity layer 104 of n-type or p-type (e.g., N+ or P+ doped) over the semiconductor substrate, a first hard mask layer 106 (e.g., silicon boron carbon nitride or silicon nitride) over the semiconductor layer, a first dielectric layer 108 (e.g., silicon dioxide) over the first hard mask layer, a second hard mask layer 110 over the first dielectric layer, a second dielectric layer 112 over the second hard mask layer and a protective layer 113 over the second hard mask layer (e.g., $HfO_2$, SiCO, etc.), in accordance with one or more aspects of the present invention.

The starting structure may be conventionally fabricated, for example, using known processes and techniques. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
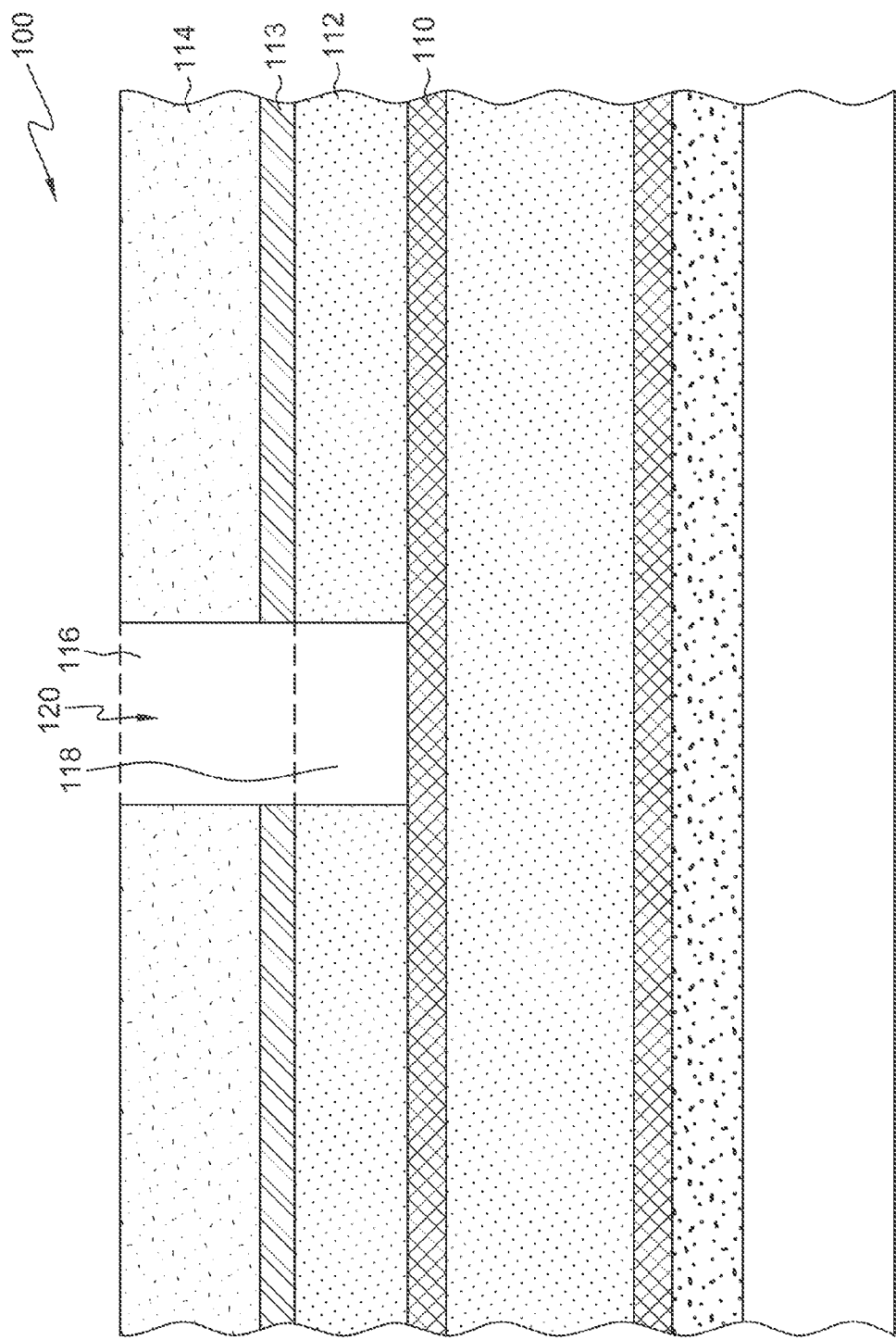
FIG. 2 depicts one example of the structure of FIG. 1 after forming a lithographic blocking layer over the protective layer, removing corresponding portions of the lithographic blocking layer and protective layer in order to remove a corresponding portion of the second dielectric layer (i.e., pattern the second dielectric layer and protective layer), leaving an opening in the second dielectric layer, in accordance with one or more aspects of the present invention.

FIG. 2 depicts one example of the structure of FIG. 1 after forming a lithographic blocking layer 114 over the protective layer 113, removing corresponding portions 116 of the lithographic blocking layer and protective layer 113 in order to remove a corresponding portion 118 of the second dielectric layer (i.e., pattern the second dielectric layer and the protective layer), leaving an opening 120 in the second dielectric layer, in accordance with one or more aspects of the present invention.

Figure 3:
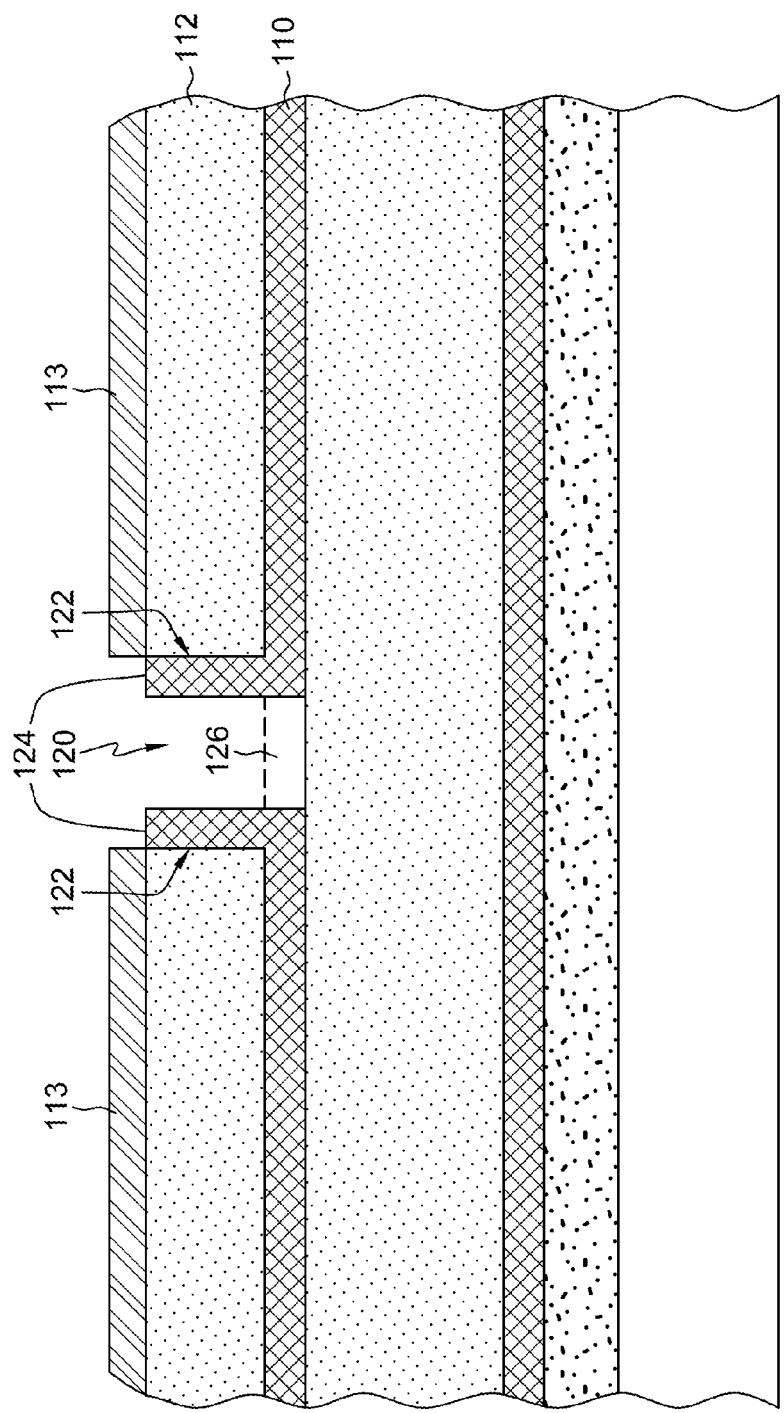
FIG. 3 depicts one example of the structure of FIG. 2 after removing the remaining lithographic blocking and lining inner walls of the opening, above second hard mask layer, with a hard mask material (same or different from the second hard mask layer) to create spacers, in accordance with one or more aspects of the present invention.

FIG. 3 depicts one example of the structure of FIG. 2 after removing remaining lithographic blocking layer (114, FIG. 2) and lining inner walls 122 of opening 120, above second hard mask layer 110, with a hard mask material (same or different from the second hard mask layer) to create spacers 124, in accordance with one or more aspects of the present invention.

Figure 4:
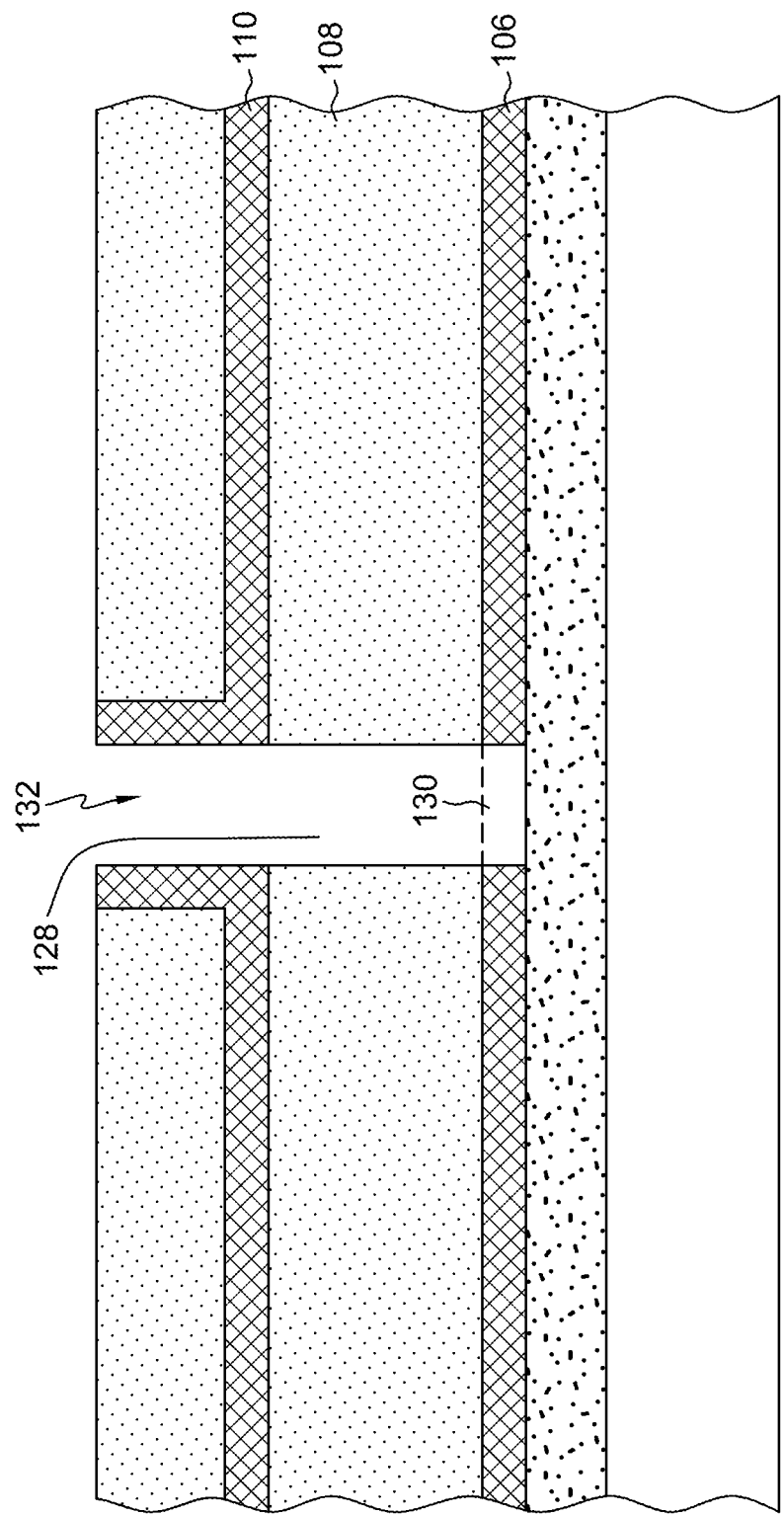
FIG. 4 depicts one example of the structure of FIG. 3 after removing portions of the second hard mask layer, the first dielectric layer and the first hard mask layer, respectively, the removing resulting in extended an opening, in accordance with one or more aspects of the present invention.

FIG. 4 depicts one example of the structure of FIG. 3 after removing portions 126, 128 and 130 of the second hard mask layer 110, the first dielectric layer 108 and the first hard mask layer 106, respectively, the removing resulting in extended opening 132, in accordance with one or more aspects of the present invention.

Figure 5:
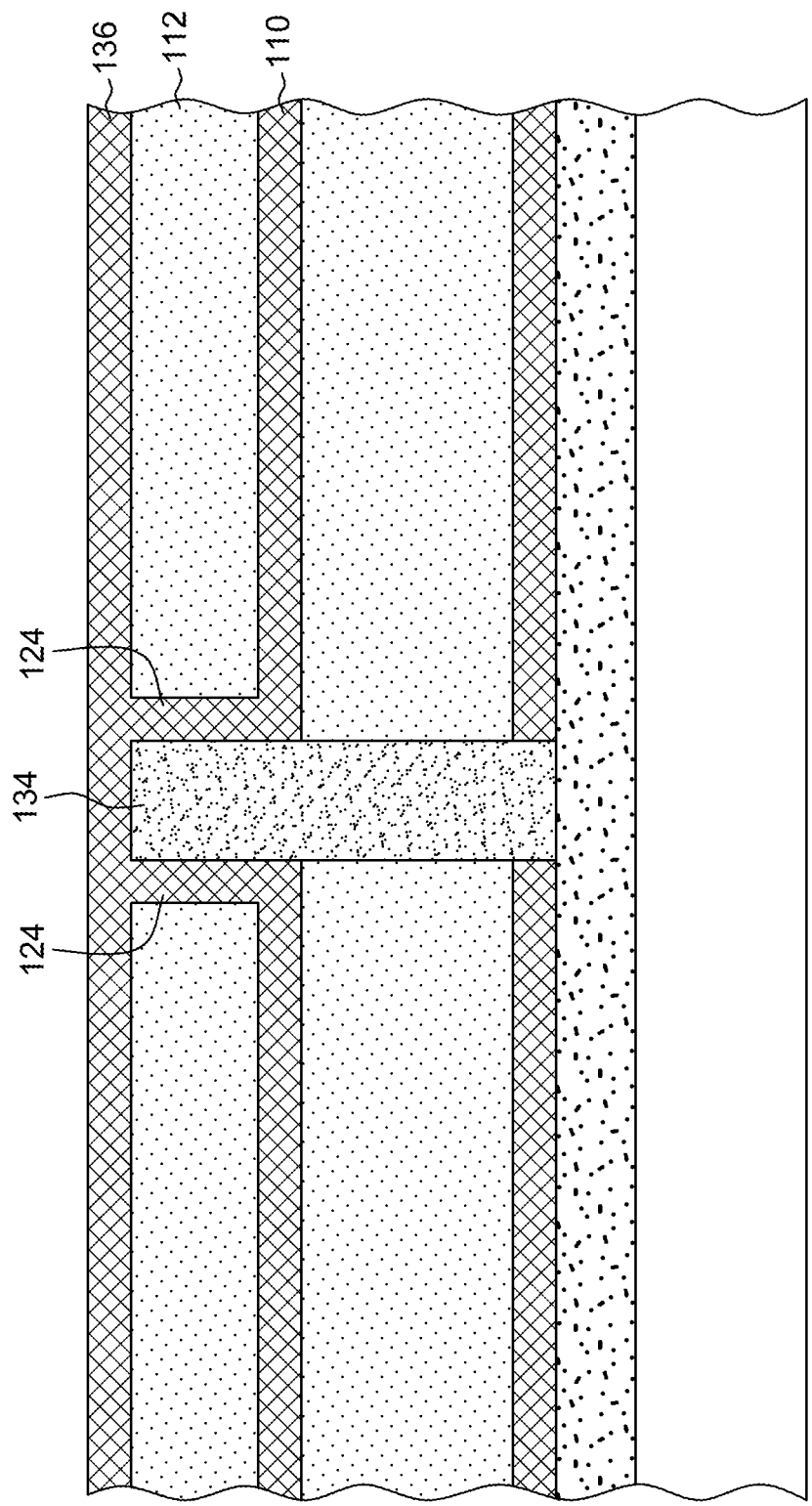
FIG. 5 depicts one example of the structure of FIG. 4 after forming epitaxial semiconductor material in the extended opening, the epitaxial semiconductor material being a vertical channel, and a capping layer of hard mask material over the epitaxial semiconductor material, the spacers and the second layer of dielectric material, in accordance with one or more aspects of the present invention.

FIG. 5 depicts one example of the structure of FIG. 4 after forming epitaxial semiconductor material 134 in the extended opening (132, FIG. 4), the epitaxial semiconductor material serving as a vertical channel, and a capping layer 136 of hard mask material over the epitaxial semiconductor material, spacers 124 and second layer of dielectric material 112, in accordance with one or more aspects of the present invention.

Figure 6:
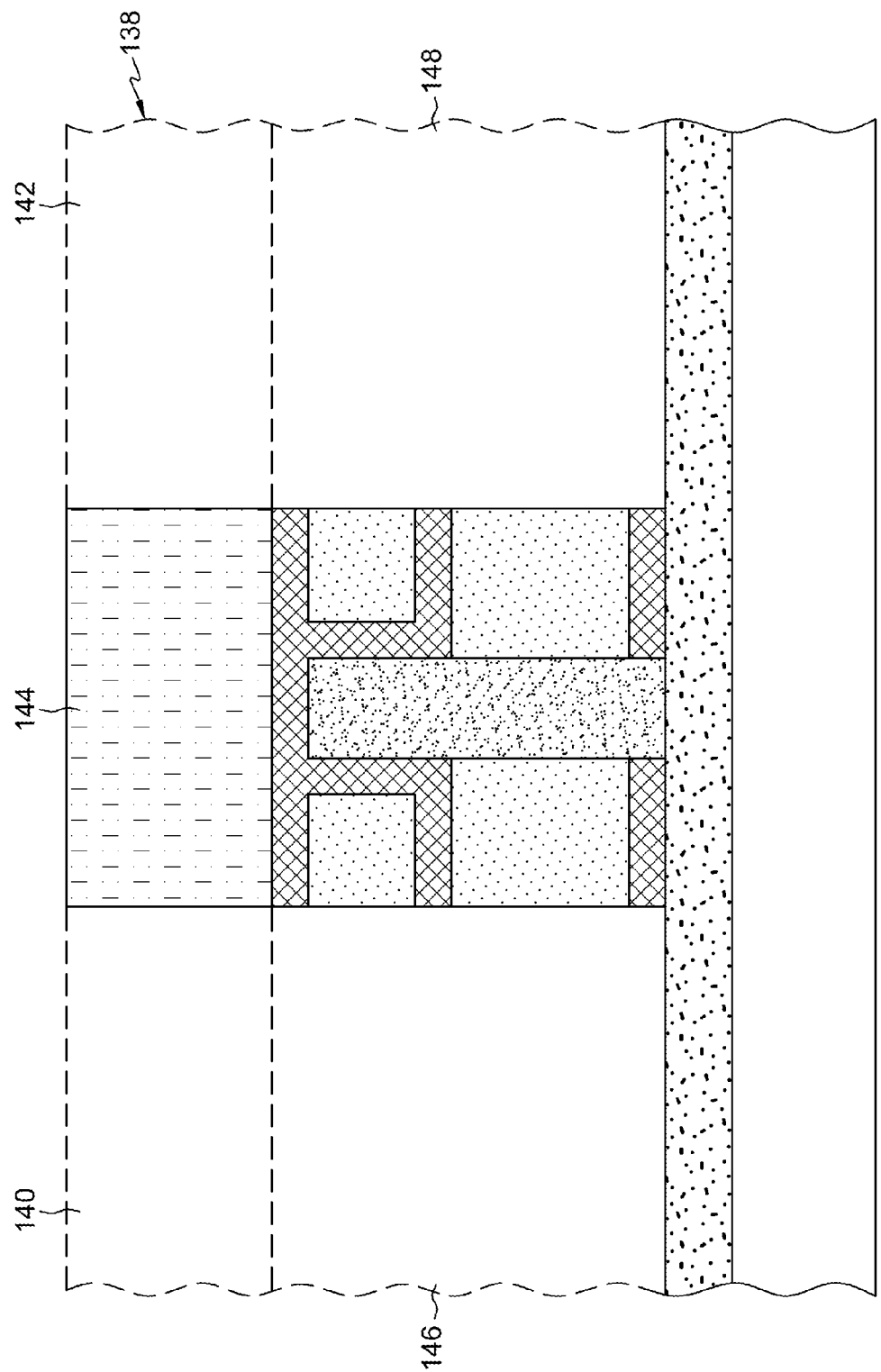
FIG. 6 depicts one example of the structure of FIG. 5 after forming a second lithographic blocking layer over the structure for gate patterning, removing the side portions of the lithographic blocking layer, leaving a middle portion of the second lithographic blocking layer to protect the structure below it, the removing of the side portions allowing the removing of the side portions of the prior structure (FIG. 5), in accordance with one or more aspects of the present invention.

FIG. 6 depicts one example of the structure of FIG. 5 after forming a second lithographic blocking layer 138 over the structure for gate patterning, removing side portions 140 and 142 of layer 138, leaving middle portion 144 of the second lithographic blocking layer to protect the structure below it, the removing of the side portions allowing the removing of side portions 146 and 148 of the prior structure (FIG. 5) therebelow, in accordance with one or more aspects of the present invention.

Figure 7:
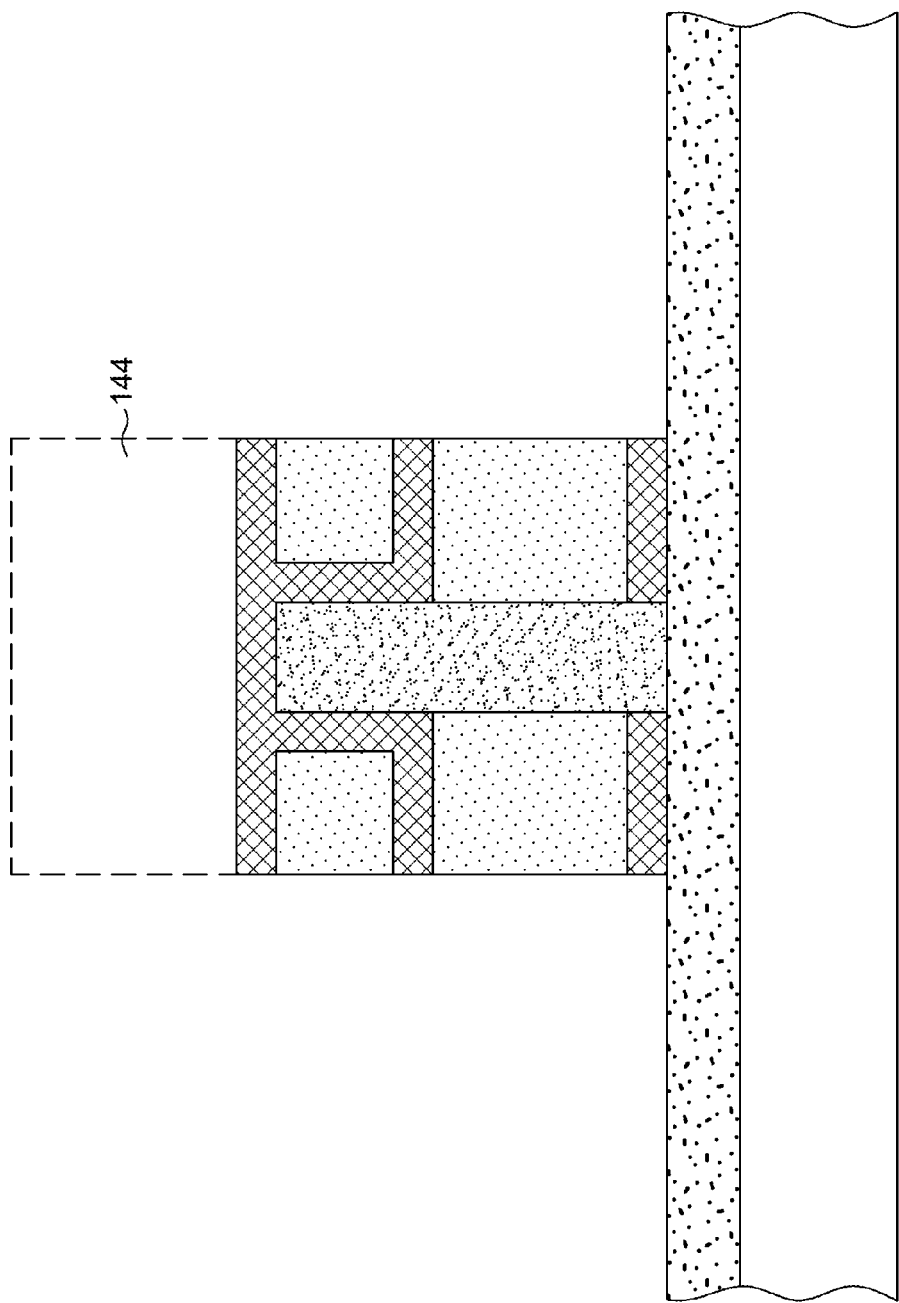
FIG. 7 depicts one example of the structure of FIG. 6 after removing the middle portion of the second lithographic blocking layer, in accordance with one or more aspects of the present invention.

FIG. 7 depicts one example of the structure of FIG. 6 after removing the middle portion 144 of the second lithographic blocking layer (138, FIG. 6), in accordance with one or more aspects of the present invention.

Figure 8:
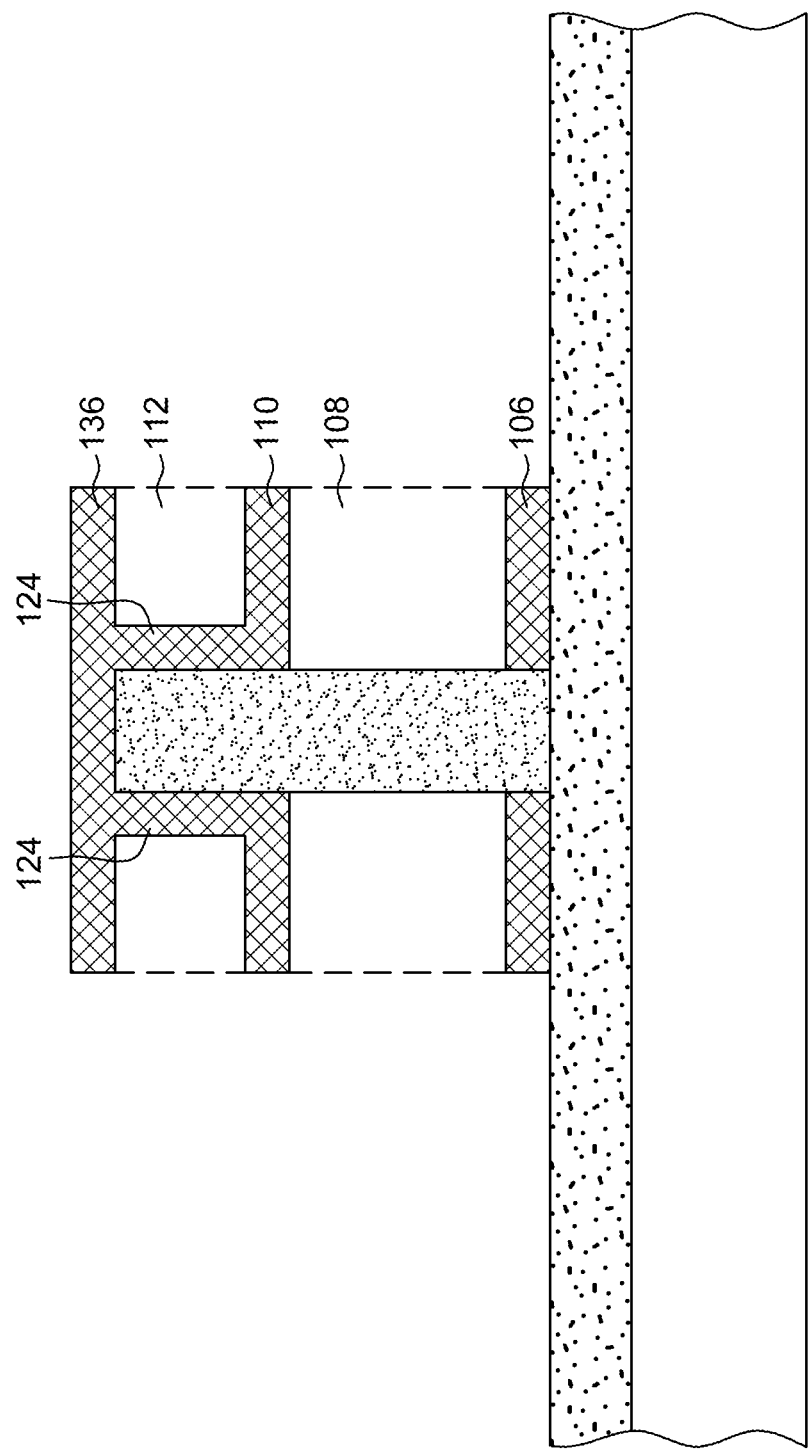
FIG. 8 depicts one example of the structure of FIG. 7 after removal of remaining dielectric material from the first and second dielectric layers, in accordance with one or more aspects of the present invention.

FIG. 8 depicts one example of the structure of FIG. 7 after removal of remaining dielectric material from the first and second dielectric layers, 108 and 112, respectively, in accordance with one or more aspects of the present invention. Removal of the dielectric layers is selective to the first hard mask layer 106, second hard mask layer 110, the top hard mask layer 136 and spacers 124. For example, if all four included a nitride, an oxide could be used for the two dielectric layers. In one example, a buffered hydrofluoric (BHF) wet removal or other isotropic dry etch process may be used to remove the dielectric layers.

Figure 9:
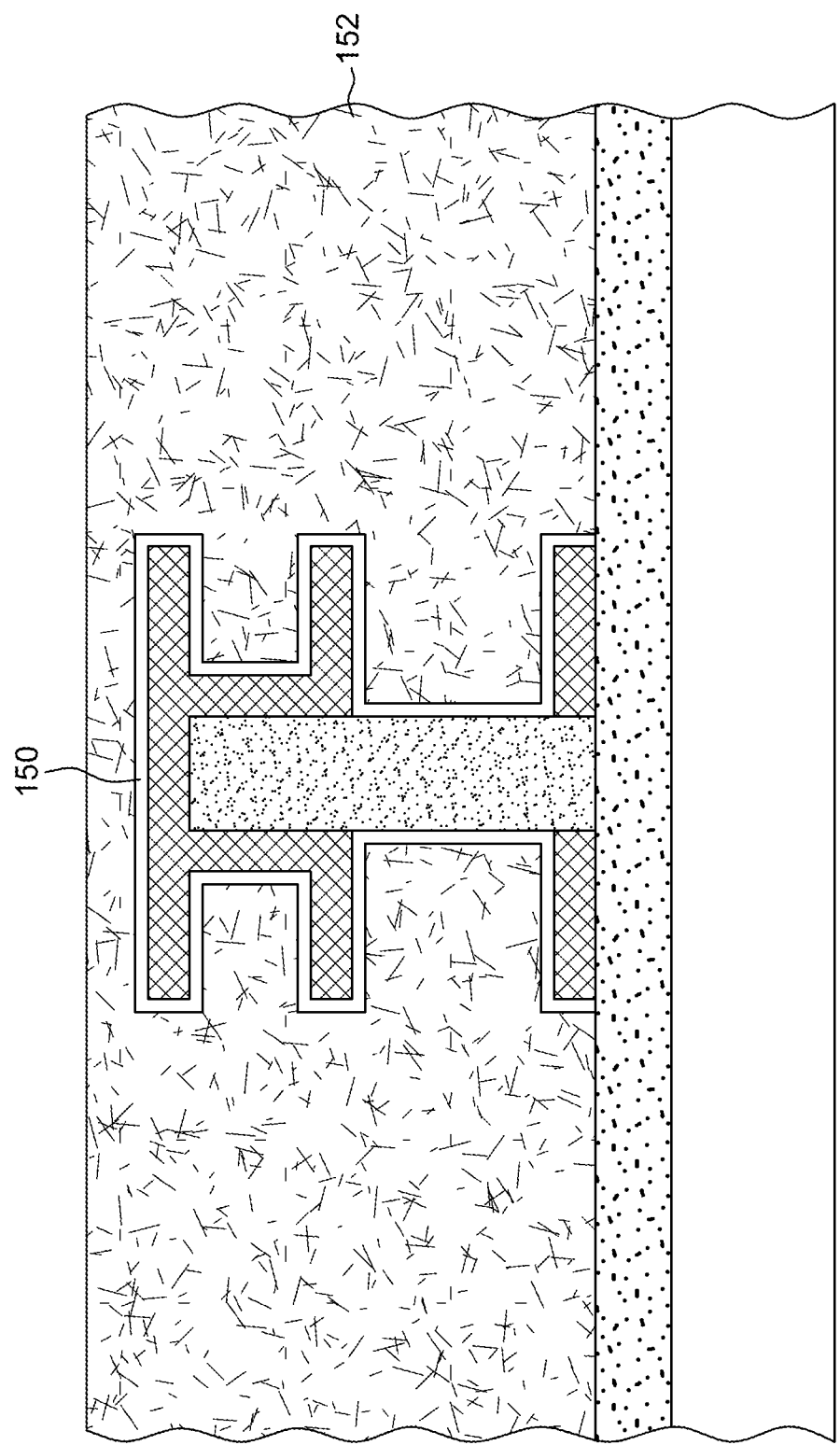
FIG. 9 depicts one example of the structure of FIG. 8 after forming a conformal dielectric layer around the structure, and forming a blanket conductive layer, in accordance with one or more aspects of the present invention.

FIG. 9 depicts one example of the structure of FIG. 8 after forming a conformal dielectric layer 150 around the structure, and forming a blanket conductive layer 152, in accordance with one or more aspects of the present invention. In one example, the conformal dielectric layer 150 may be a gate dielectric, e.g., SiON, $HfO_2$. In another example, conductive layer 152 may include work function metal(s), e.g., TaN, TiN, TaC, TiC, TiAlC, etc.

Figure 10:
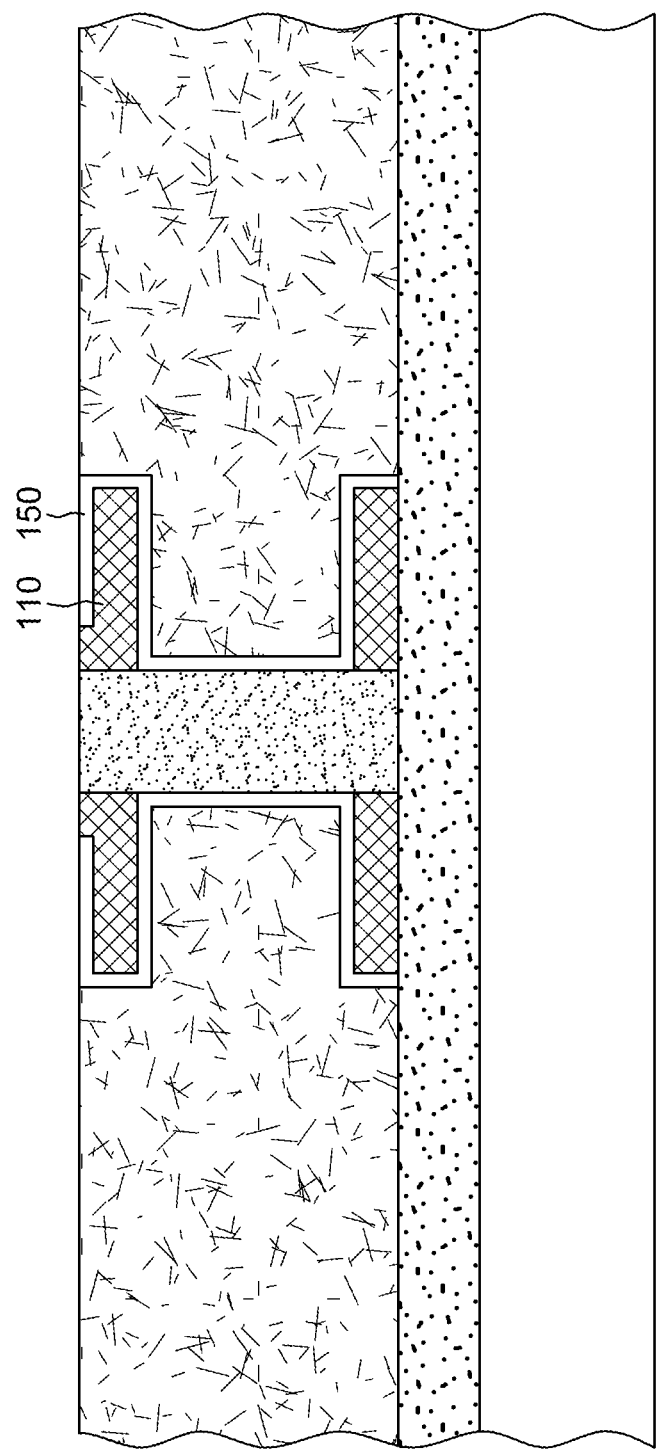
FIG. 10 depicts one example of the structure of FIG. 9 after planarizing down to the conformal dielectric layer above the second hard mask layer, in accordance with one or more aspects of the present invention.

FIG. 10 depicts one example of the structure of FIG. 9 after planarizing down to the conformal dielectric layer 150 above hard mask layer 110, in accordance with one or more aspects of the present invention.

Figure 11:
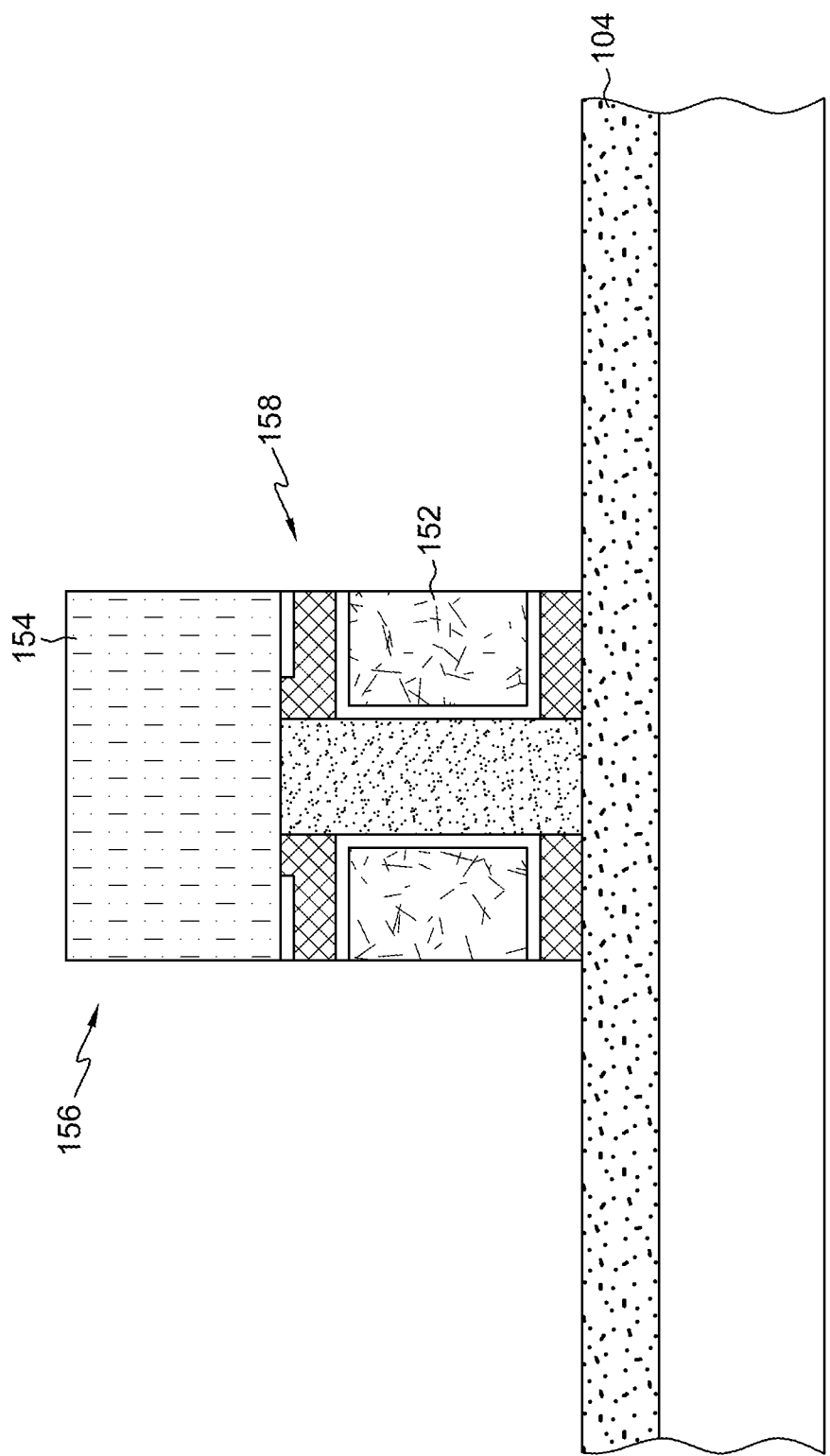
FIG. 11 depicts one example of the structure of FIG. 10 after forming a third lithographic blocking layer and removing opposite end portions, leaving a center portion of the third lithographic blocking layer, and removing opposite end portions of the FIG. 10 structure above the impurity layer, leaving a center structure, in accordance with one or more aspects of the present invention.

FIG. 11 depicts one example of the structure of FIG. 10 after forming a third lithographic blocking layer 154 and removing opposite end portions, leaving a center portion 156 thereof, and removing opposite end portions of the FIG. 10 structure above impurity layer 104, leaving a center structure 158, in accordance with one or more aspects of the present invention.

Figure 12:
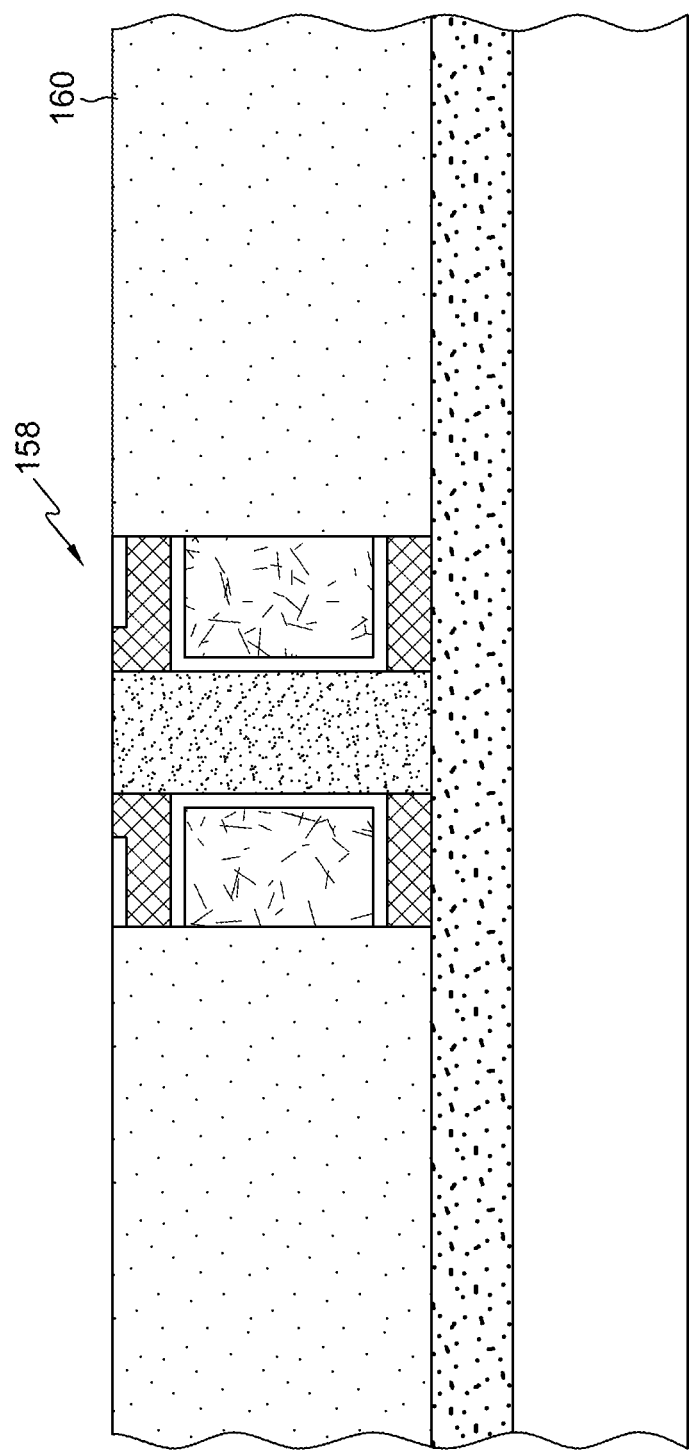
FIG. 12 depicts one example of the structure of FIG. 11 after removing the center portion of the third lithographic blocking layer, forming a dielectric layer at opposite sides of the center structure, in accordance with one or more aspects of the present invention.

FIG. 12 depicts one example of the structure of FIG. 11 after removing the center portion 156 of the third lithographic blocking layer and forming a dielectric layer 160 at opposite sides of center structure 158, in accordance with one or more aspects of the present invention.

Figure 13:
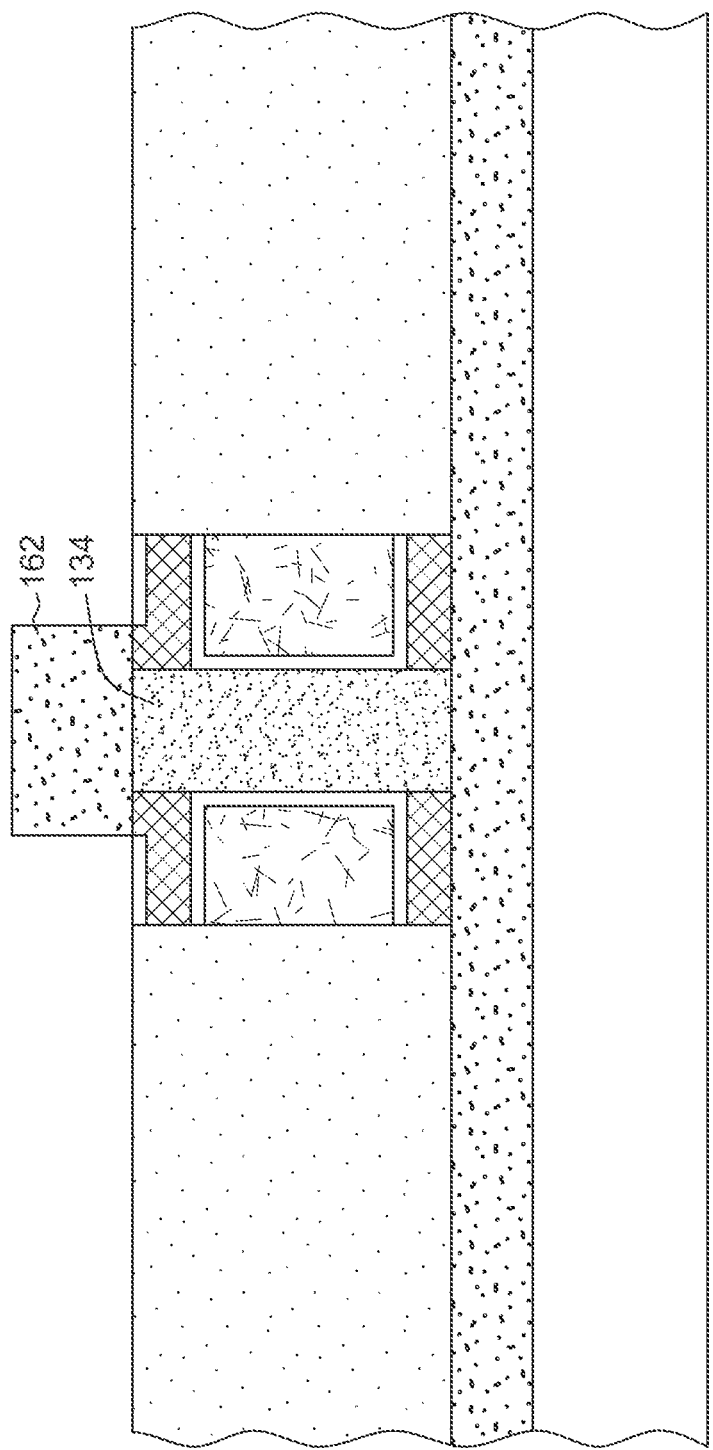
FIG. 13 depicts one example of the structure of FIG. 12 after forming top source/drain epitaxial semiconductor material above the vertical channel, in accordance with one or more aspects of the present invention.

FIG. 13 depicts one example of the structure of FIG. 12 after forming top source/drain epitaxial semiconductor material 162 above vertical channel 134, in accordance with one or more aspects of the present invention.

Figure 14:
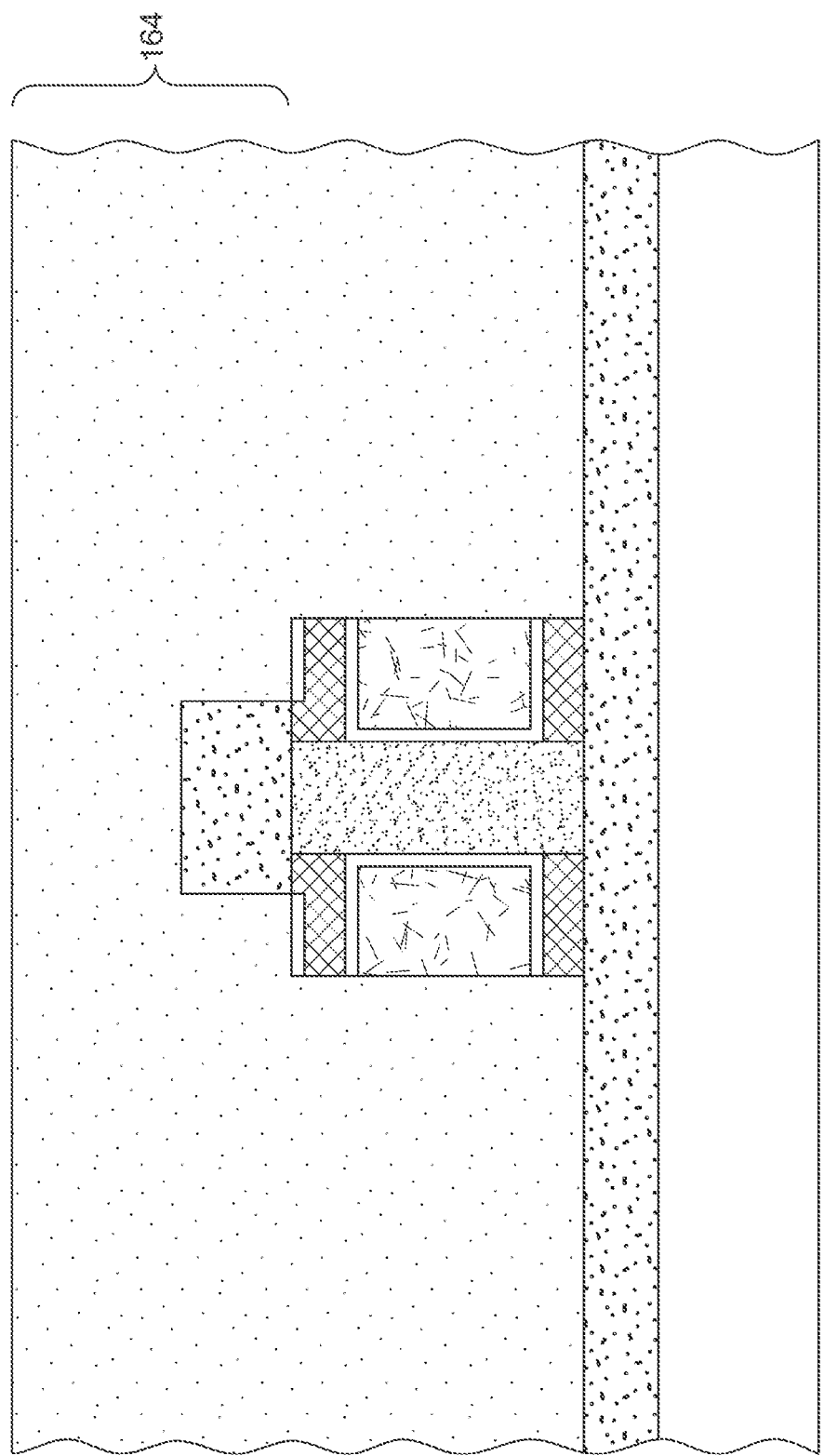
FIG. 14 depicts one example of the structure of FIG. 13 after forming a conformal dielectric layer surrounding the top source/drain epitaxial semiconductor material, in accordance with one or more aspects of the present invention.

FIG. 14 depicts one example of the structure of FIG. 13 after forming a conformal dielectric layer 164 surrounding top source/drain epitaxial semiconductor material 162, in accordance with one or more aspects of the present invention.

Figure 15:
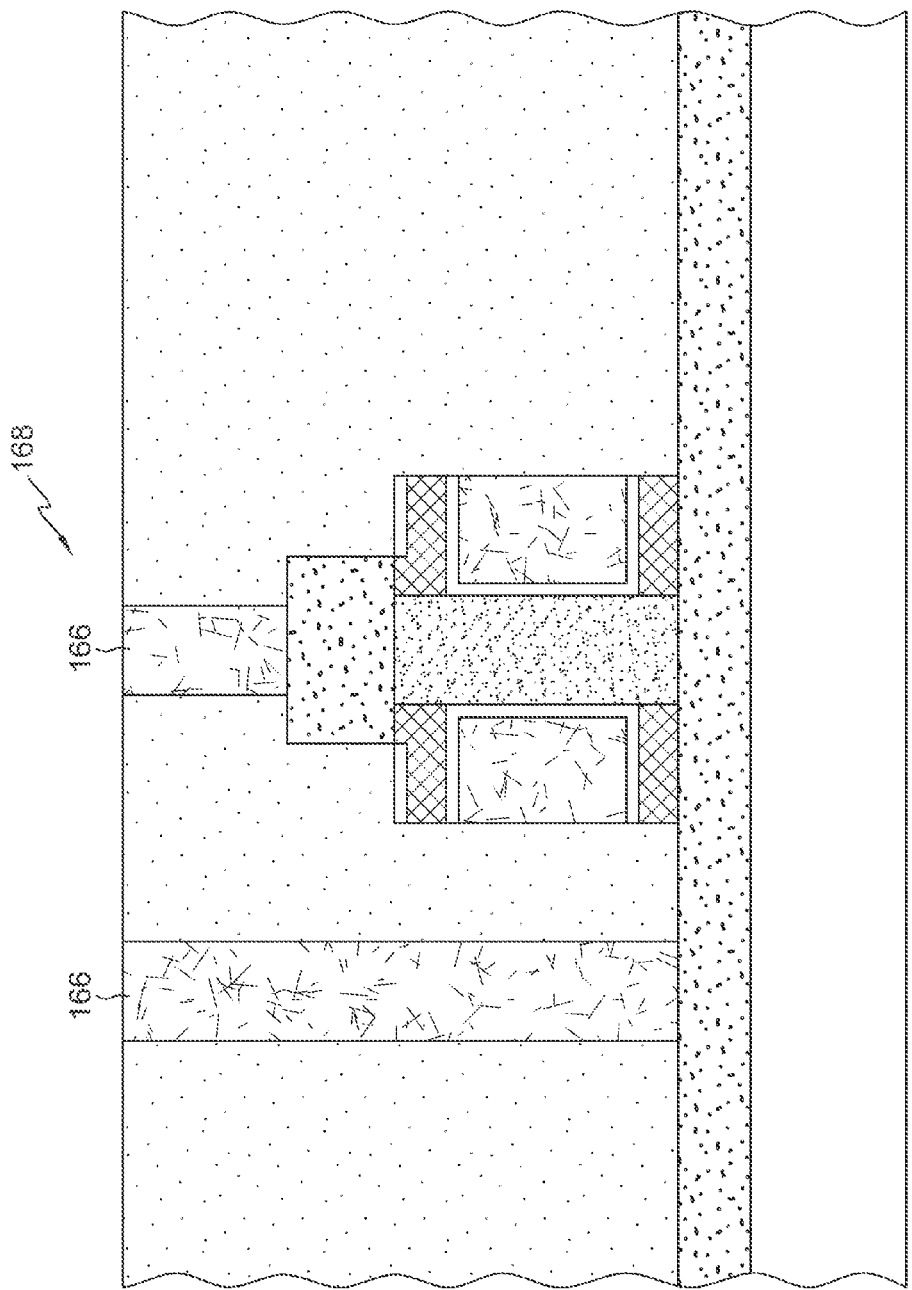
FIG. 15 depicts one example of the structure of FIG. 14 after forming source and drain contacts, resulting in a vertical transistor, in accordance with one or more aspects of the present invention.

FIG. 15 depicts one example of the structure of FIG. 14 after forming source and drain contacts 166, resulting in a vertical transistor 168, in accordance with one or more aspects of the present invention.

In a first aspect disclosed above, is a method. The method includes providing a starting semiconductor structure, the starting semiconductor structure including a semiconductor substrate, an impurity layer of n-type or p-type (e.g., N+ or P+ doped) over the semiconductor substrate, a first hard mask layer (e.g., silicon boron carbon nitride or silicon nitride) over the semiconductor layer, a first dielectric layer (e.g., silicon dioxide) over the first hard mask layer, a second hard mask layer over the first dielectric layer, and a second dielectric layer over the second hard mask layer. The method further includes patterning the second dielectric layer, the patterning forming an opening therein, forming a wrap-around spacer on an inner sidewall of the opening, the forming leaving a smaller opening, forming a vertical channel, and setting a gate length of a wrap-around gate by removing an outer portion of the structure.

In one example, patterning the second dielectric layer includes forming a first lithographic blocking layer over the second dielectric layer and removing a center portion thereof, and removing a center portion of the second dielectric layer below the removed center portion of the first lithographic blocking layer.

In one example, forming a vertical channel in the method of the first aspect includes removing center portions of the second hard mask layer, the first dielectric layer and the first hard mask layer below the smaller opening, the removing extending the smaller opening down to the impurity later, and filling the extended opening with channel material.

In one example, the method of the first aspect may further include, for example, forming a capping hard mask layer over the structure after forming the vertical channel and before setting the gate length of the wrap-around gate.

In one example, the method of the first aspect may further include, for example, replacing remaining portions of the first and second dielectric layers with conductive material (s), and planarizing the structure down to the second hard mask layer.

In one example, where the replacing and planarizing are performed, the method may further include, for example, forming dielectric material around the structure, and forming contacts for the first and second source/drain layers.

In one example, where the replacing and planarizing are performed, the replacing may include, for example, removing remaining portions of the first dielectric layer and the second dielectric layer, and surrounding the structure, after removing remaining dielectric, with conductive material(s). In one example, the method may further include, for example, after removing remaining dielectric and before the surrounding, forming a conformal dielectric layer around the structure.

Thus, the present invention accurately sets the gate length when forming the first dielectric layer (FIG. 1, 108). Bottom and top spacer thickness is accurately set by forming the first hard mask layer (FIG. 1, 106) and the second hard mask layer (FIG. 1, 110). Further, the second hard mask layer is protected by a dielectric or hard mask layer throughout fabrication, and the final planarization may stop on the second hard mask layer. Subsequently, the top spacer thickness may be set.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a starting semiconductor structure, the starting semiconductor structure comprising a semiconductor substrate, an impurity layer of n-type or p-type over the semiconductor substrate, a first hard mask layer over the semiconductor layer, a first dielectric layer over the first hard mask layer, a second hard mask layer over the first dielectric layer, a second dielectric layer over the second hard mask layer and a protective layer over the second dielectric layer;
   patterning the second dielectric layer and the protective layer, the patterning forming an opening therein;
   forming a wrap-around spacer on an inner sidewall of the opening, the forming leaving a smaller opening;
   forming a vertical channel; and
   setting a gate length of a wrap-around gate by removing an outer portion of the structure.

2. The method of claim 1, wherein patterning the second dielectric layer comprises:
   forming a first lithographic blocking layer over the second dielectric layer and removing a center portion thereof; and
   removing a center portion of the second dielectric layer below the removed center portion of the first lithographic blocking layer.

3. The method of claim 1, wherein forming a vertical channel comprises:
   removing center portions of the second hard mask layer, the first dielectric layer and the first hard mask layer below the smaller opening, the removing extending the smaller opening down to the impurity later; and
   filling the extended opening with channel material.

4. The method of claim 1, further comprising forming a capping hard mask layer over the structure after forming the vertical channel and before setting the gate length of the wrap-around gate.

5. The method of claim 1, further comprising:
   replacing remaining portions of the first and second dielectric layers with at least one conductive material; and
   planarizing the structure down to the second hard mask layer.

6. The method of claim 5, further comprising:
   forming dielectric material around the structure; and
   forming contacts for the first and second source/drain layers.

7. The method of claim 5, wherein the replacing comprises:
   removing remaining portions of the first dielectric layer and the second dielectric layer; and
   surrounding the structure, after removing remaining dielectric, with at least one conductive material.

8. The method of claim 7, further comprising, after removing remaining dielectric and before the surrounding, forming a conformal dielectric layer around the structure.

* * * * *